United States Patent [19]
Matsumura

[11] Patent Number: 5,919,529
[45] Date of Patent: Jul. 6, 1999

[54] APPARATUS FOR AND METHOD OF PROCESSING SUBSTRATE

[75] Inventor: Yoshio Matsumura, Hikone, Japan

[73] Assignee: Dainippon Screen Mfg. Co., Ltd., Japan

[21] Appl. No.: 08/595,767

[22] Filed: Feb. 2, 1996

[30] Foreign Application Priority Data

Feb. 13, 1995 [JP] Japan .................................. 7-024095

[51] Int. Cl.[6] .............................. B05D 3/00; B05C 13/00; B08B 3/00
[52] U.S. Cl. ...................... 427/398.1; 118/500; 118/503; 134/90; 134/105; 134/468.2; 134/902; 427/240; 427/299; 427/314; 427/553; 427/372.2
[58] Field of Search .............................. 427/430.1, 398.1, 427/372.2, 299, 553, 314; 118/500, 503; 134/90, 105, 902, 468.2

[56] References Cited

U.S. PATENT DOCUMENTS

| | | | |
|---|---|---|---|
| 4,849,253 | 7/1989 | Maricle | 427/424 |
| 4,871,579 | 10/1989 | Bravet et al. | 427/424 |
| 4,985,722 | 1/1991 | Ushijima et al. | 354/319 |
| 5,069,155 | 12/1991 | Kunze-Concewitz | 118/503 |
| 5,252,364 | 10/1993 | Inoue et al. | 427/424 |
| 5,569,439 | 10/1996 | Cardini et al. | 427/424 |
| 5,578,127 | 11/1996 | Kimura | 118/503 |

*Primary Examiner*—Janyce Bell
*Attorney, Agent, or Firm*—Ostrolenk, Faber, Gerb & Soffen, LLP

[57] ABSTRACT

A plurality of transporter robots are provided on respective rails. Each semiconductor substrate is transported by a first robot from an indexer to processing units and then to a cooling plate. The second robot comes to the cooling plate and transports the substrate to other processing units. The cooling plate is used as an interface for the exchange of the substrate between the robots. No liquids nor gasses are applied to the substrate in the cooling plate and the substrate is passed to the next robot without contamination. No dedicated buffers are required, and thereby the size of the apparatus is reduced.

62 Claims, 4 Drawing Sheets

APPARATUS FOR AND METHOD OF PROCESSING SUBSTRATE

BACKGROUND OF THE INVENTION

1. Field of the Invention

The present invention relates to an apparatus for and a method of serially transporting a substrate to respective units for rinsing, drying, cooling, application of resist, development and/or the like. The substrate may he a semiconductor wafer, a glass substrate for a liquid-crystal display, a printed board, a substrate for a color filter or a ceramic substrate for a thermal head.

2. Description of the Prior Arts

A conventional apparatus for processing a substrate includes a first transporter for transporting a substrate in a first processing system, a second transporter for transporting the substrate in a second processing system adjacent to the first processing system, and a buffer mechanism provided between the first and second processing systems for transferring the substrate between the first and second transporters. The two transporters, i.e., the first and second transporters, are provided to reduce a tact time. That is, when the first and second processing systems have many processing units and only one transporter is provided to transport the substrate in both processing systems, the transporter is overloaded and reduction of the tact time is difficult.

Although the conventional apparatus is effective for reducing the tact time, the plane size of the apparatus is inevitably increased.

SUMMARY OF THE INVENTION

The present invention is directed to an apparatus for processing a substrate.

According to the present invention, the apparatus comprises a processing system and transporter means. The processing system has an arrangement of first processing means for applying a first processing to the substrate, second processing means for applying a second processing to the substrate, and third processing means for applying a third processing to the substrate. The transporter system has first transporter means for transporting the substrate from the first processing means to the second processing means, and second transporter means for transporting the substrate from the second processing means to the third processing means.

According to the present invention, no buffers are necessary for passing the substrate from the first transporter means to another transporter means, and the plane size of the apparatus is reduced.

Preferably, the second processing means is thermal processing means for applying a thermal processing to the substrate. The substrate is not subjected to liquids or gases.

Preferably, the thermal processing means is a cooling means for cooling the substrate. The substrate is not subjected to heat affecting the thermal characteristics of the substrate.

In a preferred embodiment of the present invention, the first and second transporter means are provided on different rails partially overlapping with each other in a horizontal direction.

In another preferred embodiment of the present invention, the first to third transporter means are provided on a common rail, and the number of rails is reduced.

In a preferred embodiment of the present invention, the first to third processing means are distributed in a stack of processing trains each consisting of a linear arrangement of a plurality of processing means. The stack is effective for further reducing the plane size of the apparatus.

The present invention further provides a method of processing a substrate corresponding to the present apparatus.

Accordingly, an object of the present invention is to reduce the plane size of an apparatus for processing a substrate.

These and other objects, features, aspects and advantages of the present invention will become more apparent from the following detailed description of the present invention when taken in conjunction with the accompanying drawings.

DESCRIPTION OF PREFERRED EMBODIMENTS

Figure 1:
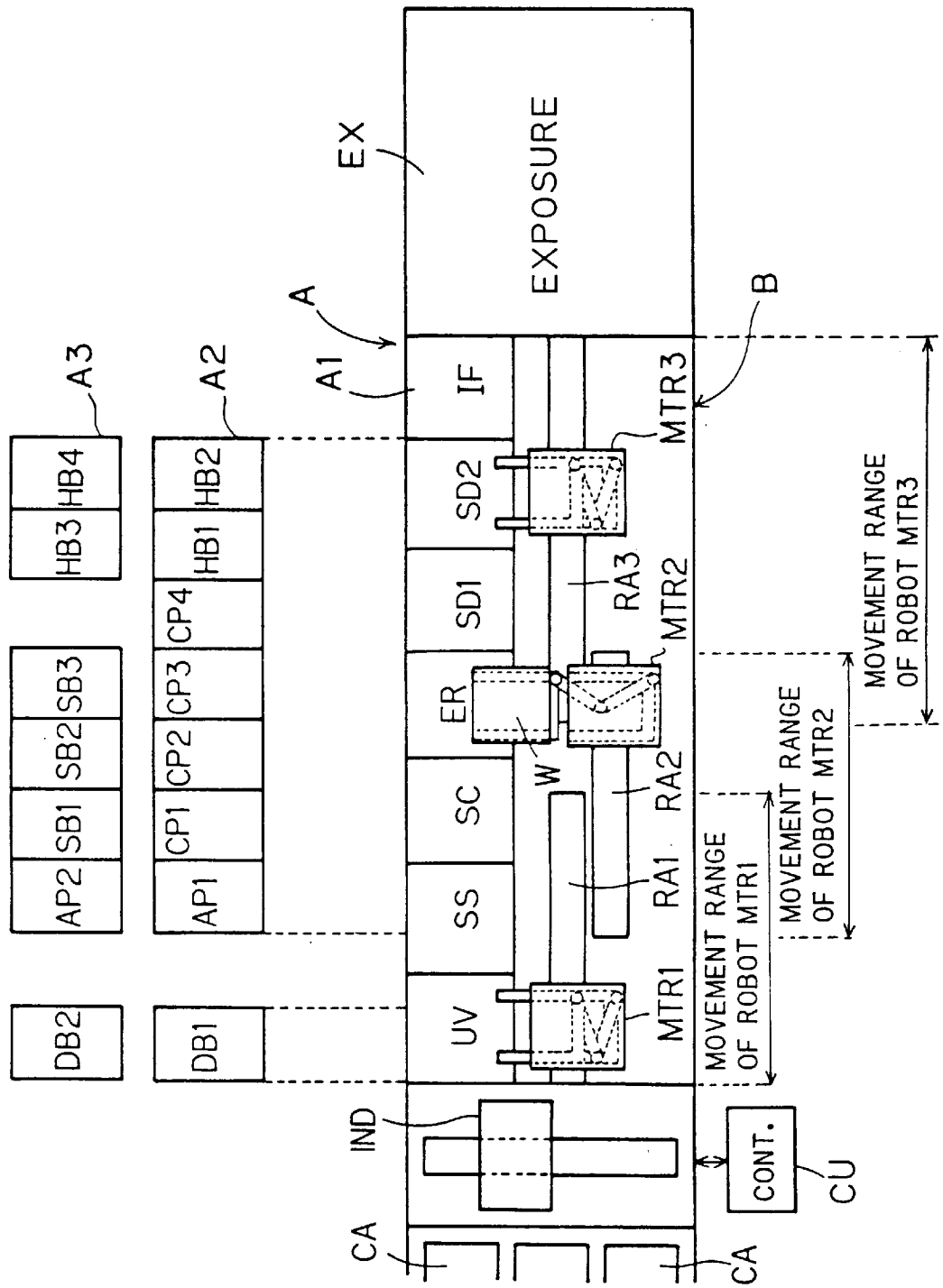
FIG. 1 is a plane view of an apparatus for processing a substrate according to a preferred embodiment of the present invention.

FIG. 1 is a plane view of an apparatus for processing a substrate according to a preferred embodiment of the present invention. The apparatus is operable to apply a series of processes to semiconductor substrates. The processes may include application of an ultraviolet ray, reinforcement of adhesion, edge rinsing, heating, cooling and/or development.

In FIG. 1, a plurality of cassettes CA are provided, in which a plurality of semiconductor substrates are contained. The substrates are serially taken out from the cassettes CA, one by one, an indexer IND. The apparatus comprises a processing area A in which a plurality of processing units are provided. Each substrate W is processed in the processing units and is then transported to an exposure system EX. After exposure to light, the substrate W is fed-back to the processing area A and is processed in the processing units therein. The substrate W is then backed into the cassette CA by the indexer IND.

Three processing trains or processing systems A1 to A3 are provided in the processing area A. The first processing train A1 is a horizontal linear alignment of:

1) an ultraviolet ray unit UV for applying an ultraviolet ray to the substrate W;
2) a spin scrubber SS for rinsing the substrate W;
3) a spin coater SC for coating the substrate W with a resist layer;
4) an edge rinsing unit ER for rinsing the edges of the substrate W;
5) spin developers SD1 and SD2 for developing the resist on the substrate W; and
6) an interface IF for coupling the first processing train A1 to the exposure system EX.

The second and third processing trains A2 and A3 are serially stacked on the first processing train A1, although they are illustrated on the plane of FIG. 1 for convenience of illustration. The second processing train A2 is a horizontal linear alignment of:

1) a dehydration-bake unit DB1 for applying drying process to the substrate W;

2) a unit AP1 for reinforcement of adhesion;

3) cooling plates CP1 to CP4 for cooling the substrate W;

4) and hard-bake units HB1 and HB2 for drying the substrate W after exposure.

The third processing train A3 is a horizontal linear alignment of:

1) a dehydration-bake unit DB2 for applying drying process to the substrate W;

2) a unit AP2 for reinforcement of adhesion;

3) soft-bake units SB1 to SB3 for drying the resist; and 4) hard-bake units HB3 and HB4 for drying the substrate W after exposure.

The bake units SB1 to SB3 and HB1 to HB4 and the cooling plates CP1 to CP4 are "thermal processing units" for applying thermal processings to the substrate W.

The apparatus further provided with a transporting area B extending along the processing area A. The transporting area B is provided thereon three transporter robots MTR1 to MTR3 which are provided on rails RA1 to RA3 and movable along the rails RA1 to RA3, respectively. The three transporter robots MTR1 to MTR3 cooperate to transport the substrates among respective processing units in the first to third processing trains A1 to A3. The movement of each transporter robot MTR1, MTR2, MTR3 is cyclic and each substrate W is serially transported along the processing units to be subjected to respective surface processings therein.

Figure 2:
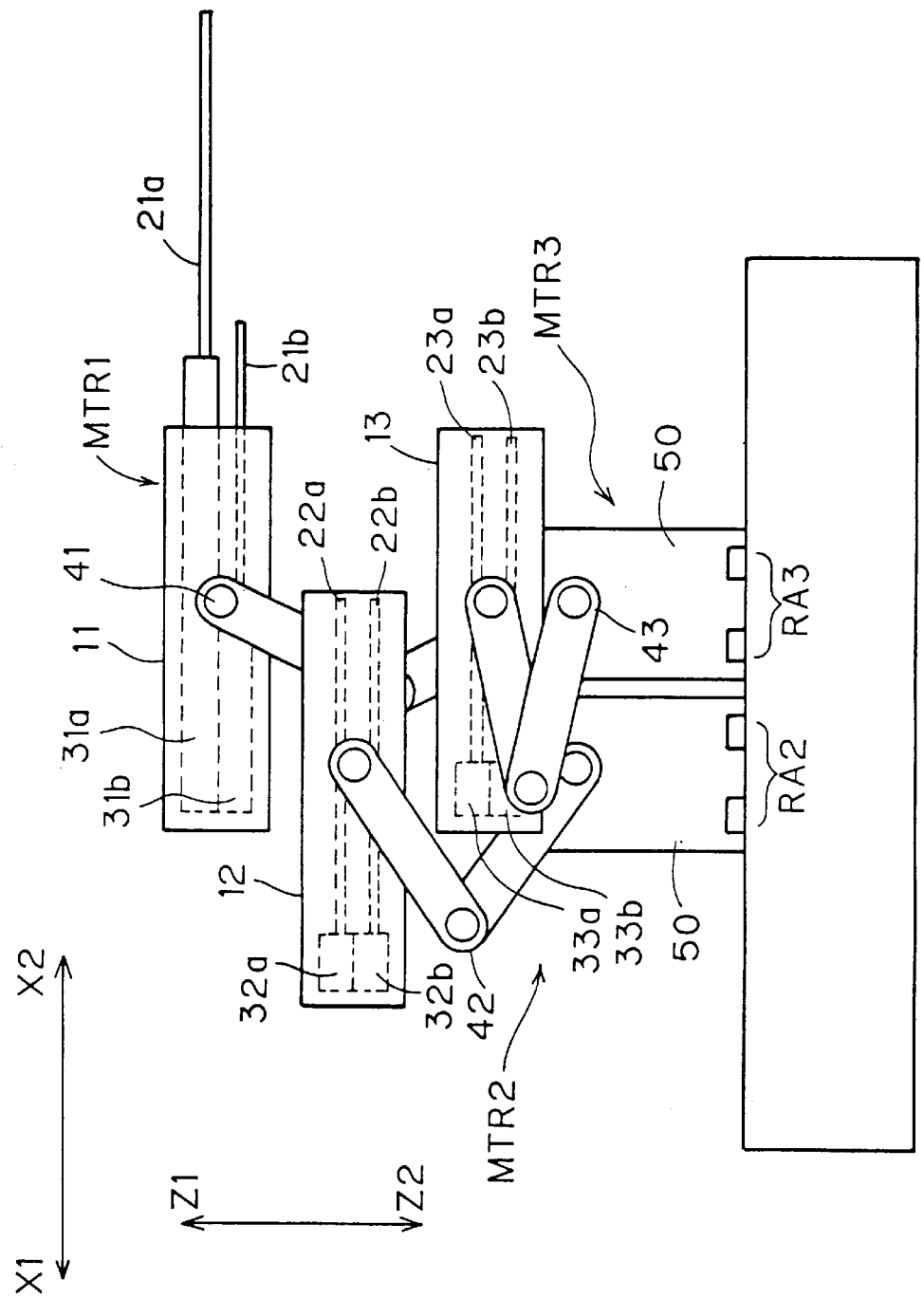
FIG. 2 is a side view of transporter robots provided in the apparatus of FIG. 1.

FIG. 2 is a side view of the transporter robots MTR1 to MTR3. The first transporter robot MTR1, which is provided in the rear position in the side view, comprises a housing 11 for shielding particles. The housing 11 can receive two hands 21a and 21b for holding substrates, and two arms 31a and 31b for supporting the hands 21a and 21b while allowing the movement of the hands 21a and 21b in the horizontal direction X1–X2. The second transporter robot MTR2, which is provided in the middle position in the side view, also comprises a housing 12 for shielding particles. The housing 12 can receive two hands 22a and 22b for holding substrates, and two arms 32a and 32b for supporting the hands 22a and 22b while allowing the movement of the hands 22a and 22b in the horizontal direction X1 to X2. Further, the third transporter robot MTR3, which is provided in the front position in the side view, also comprises a housing 13 for shielding particles. The housing 13 can receive two hands 23a and 23b for holding substrates, and two arms 33a and 33b for supporting the hands 23a and 23b while allowing the movement of the hands 23a and 23b in the horizontal direction X1–X2.

The housings 11 to 13 of the transporter robots MTR1 to MTR3 are supported by arms 41 to 43 provided on respective base plates 50, and are movable in the vertical direction Z1–Z2 while maintaining the horizontal arrangements of the housings 11 to 13. The base plates 50 are horizontally movable in the respective ranges defined by the rails RA1 to RA3 (FIG. 1). Accordingly, within the ranges of the rails RA1 to RA3, the housings 11 to 13 can face to an arbitrary one of the processing units which are two-dimensionally stacked on the processing area A, respectively.

Since each of the housings 11 to 13 comprises two hands (21a, 21b), (22a, 22b), (23a, 23b), exchange of two substrates is possible between an arbitrary one of the transporter robots MTR1, MTR2, MTR3 and one processing unit currently facing to the one transporter robot. For example, the transporter robot MTR1 with the first vacant hand 21a and the second hand 21b holding a first substrate 21b moves to a processing unit, the transporter robot MTR1 receives a second substrate with the first hand 21a from the processing unit and then the first substrate is inserted into the processing unit with the second hand 21b. Typically, the first substrate is a substrate which is carried from a previous processing unit and the second substrate is a substrate which has been processed in the processing unit. The exchange process is also attained by each of the other transporter robots MTR2 and MTR3.

With reference to FIG. 1 again, the transporter robots MTR1 to MTR3 can move in a same horizontal direction, which is a longitudinal direction of the transport area B, and the ranges of the horizontal movements of the transporter robots MTR1 to MTR3 are defined by the ranges of the rails RA1 to RA3, respectively, which are different from each other. Due to the difference, each substrate should be passed from one transporter robot to the next transporter robot without interference of transporter robots MTR1 to MTR3. Although this is attained by providing a buffer table between the transporter robots, the plane size of the apparatus is increased by the buffer table. Under the circumstances, the apparatus according to the preferred embodiment of the present invention as illustrated is constructed such that respective adjacent rails (RA1, RA2) and (RA2, RA3) are partially overlapped in their horizontal ranges along the longitudinal direction of the transport area B, and part of processing units facing to the overlapped ranges are employed as interface units for passing or exchanging substrate(s) between the adjacent transporter robots.

In other words, specific processing units selected among the processing units facing to the overlapped ranges can be accessed by two adjacent robots (MTR1, MTR2) and (MTR2, MTR3) for exchange of substrates. More particularly, both of the adjacent two robots MTR1 and MTR2 can access the cooling plate CPI while both of the adjacent two robots MTR2 and MTR3 can access the cooling plate CP3. That is, the cooling plates CP1 and CP3 are employed as interfaces between adjacent two robots (MTR1, MTR2) and (MTR2, MTR3), respectively.

Preferably, the interfaces are selected among the thermal processing units (i.e., the cooling plates and bake units) and non-thermal processing units (i.e., the spin scrubber SS, the spin coater SC, the units AP1 and AP2 for reinforcement of adhesion, and the edge rinsing unit ER) are excluded from the selection. This is because liquid or gas, which is used in these non-thermal processing units, would contaminate the substrates. However, if the processing schedule is such that the substrate temporarily placed on the interface unit is subjected to the non-thermal process in the next step, the processing unit for the non-thermal process may be employed as an interface unit.

Preferably, the soft-bake units SB1 and SB2 are also excluded from the selection of the interfaces if the apparatus is used for processing substrates whose thermal history is important for the quality of the substrates, since the soft-bake units SB1 and SB2 are at high temperature and would affect the thermal history of the substrates.

Because of these reasons, the cooling plates CP1 and CP3 are the best choice for the interfaces between the adjacent robots. No heat is applied to the substrates in the cooling plates and the history of the substrates is not affected. After the cooling processes in the cooling plates CPI and CP3, the substrates may be maintained on the cooling plates CP1 and CP3 for waiting exchange of the substrates between adjacent robots. This is effective for adjusting a timing schedule of surface processings in control of a minimum tact time.

Each of the transporter robots MTR1 to MTR3 are driven by a driving mechanism and is controlled by a control unit CU (FIG. 1) having a microcomputer and sensors for monitoring the operations of the transporter robots MTR1 to MTR3. The control unit CU is also operable to control process timings and process conditions of the respective processing units included in the first to third processing trains A1 to A3 on the processing area A.

Figure 3:
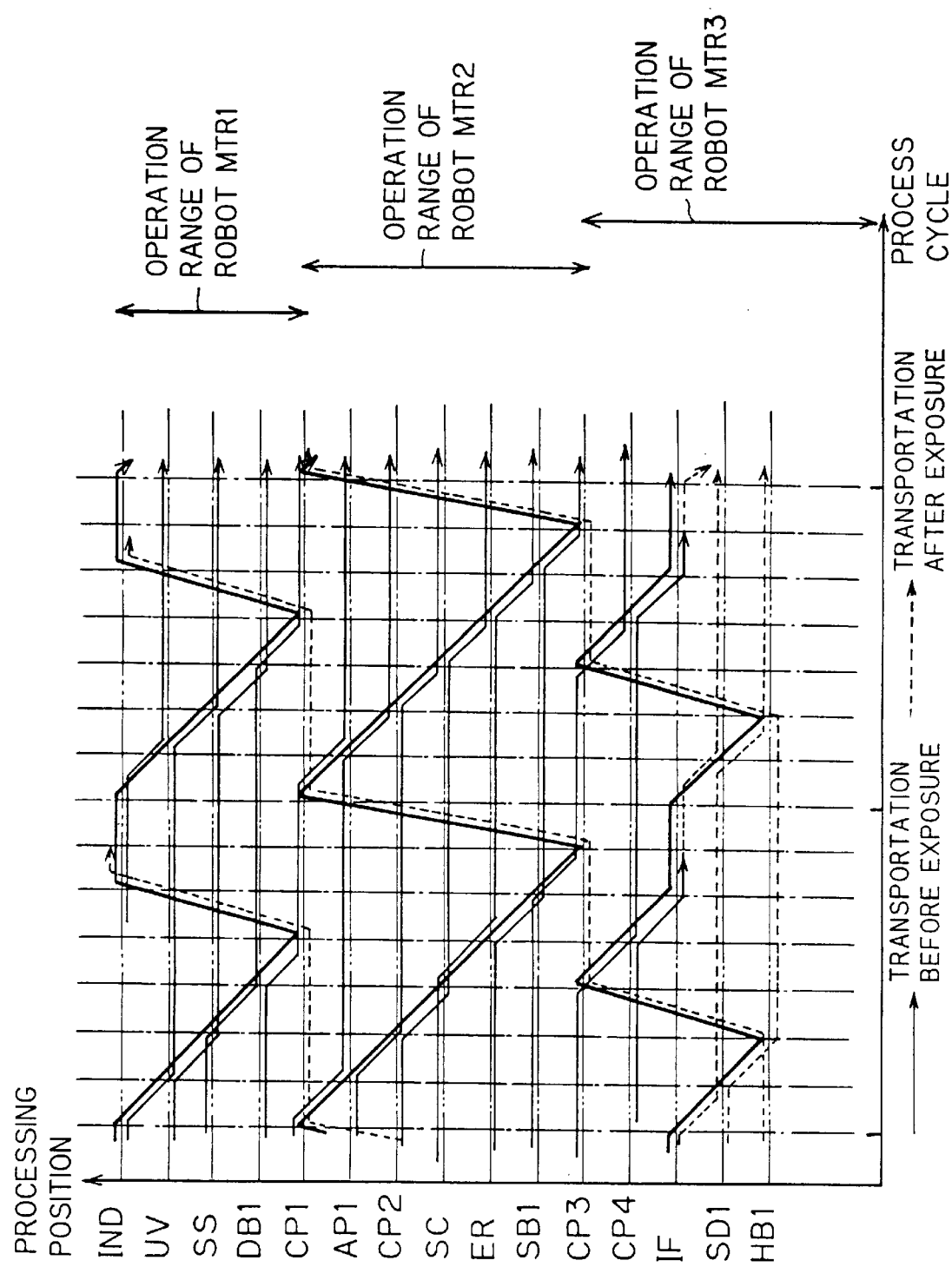
FIG. 3 is a diagram for explaining an operation of the apparatus of FIG. 1.

Next, the operations of the apparatus of FIG. 1 are described. FIG. 3 is a transportation diagram illustrating an example of the transportation and processing of a substrate W in the apparatus of FIG. 1.

In FIG. 3, 1) the ordinate of FIG. 3 defines current positions of the substrate W among the respective processing units;

2) the abscissa defines processing cycles corresponding to time;

3) the wide lines are the movements of the transporter robots MTR1 to MTR3;

4) the narrow lines are the movements and processing of the substrates before exposure;

5) the broken lines are the movements and processing of the substrates after exposure; and 6) the vertical parallel dashed lines define unit actions of transportation and exchanges of substrates by the transporter robots MTR1 to MTR3. For each of the transporter robots MTR1 to MTR3, each periodic cycle of the transportation of substrates is completed by seven actions.

As understood from FIG. 3, the first transporter robot MTR1 repeats its cyclical transportation in the order of:

1) the indexer IND;
2) the ultraviolet ray unit UV;
3) the spin scrubber SS;
4) the dehydration-bake unit DB1; and
5) the cooling plate CP1, the second transporter robot MTR2 repeats its cyclical transportation in the order of:

1) the cooling plate CP1;
2) the unit AP1 for reinforcement of adhesion;
3) the cooling plate CP2;
4) the spin coater SC;
5) the edge rinsing unit ER;
6) the soft-bake unit SB1; and
7) cooling unit CP3, and the third transporter robot MTR3 repeats its cyclical transportation in the order of:

1) the cooling plate CP3;
2) the cooling plate CP4;
3) the interface IF;
4) the spin developer SD1; and
5) the hard-bake unit HB1.

When attention is directed to a substrate W before exposure, the substrate W is taken out from the cassette CA and then placed on the indexer IND. The substrate W is then transported by the first transporter robot MTR1 to the ultraviolet ray unit UV, the spin scrubber SS and the dehydration-bake Unlit DB1 for respective processings in series. Then, the substrate W is transported to the cooling plate CP1 and is temporarily held on the cooling plate CP1 to await the second transporter robot MTR2. The substrate W is cooled-down during the waiting, but the process does not affect the prior thermal exposure of the substrate W because no heat is applied to the substrate W. This is true also in other waiting periods of the substrate W on the cooling plates which will be described later.

The second transporter robot MTR2 comes to the cooling plate CP1 and takes the substrate W from the cooling plate CP2, and then transports the substrate W to the unit AP1 for reinforcement of adhesion, the cooling plate CP2, the spin coater SC, the edge rinsing unit ER, and the soft-hake unit SB1 for respective processing in series. Then, the substrate W is transported to the cooling plate CP3 and is temporarily held on the cooling plate CP3 to await the third transporter robot MTR3.

The third transporter robot MTR3 comes to the cooling plate CP3 and takes up the substrate W from the cooling plate CP3 and then transports the substrate W to the cooling plate CP4 for cooling-down. Then, the substrate W is transported to the interface IF and is provided to the exposure system EX for exposure to light.

On the other hand, when attention is directed to a substrate W after exposure, the substrate W is taken out from the exposure system EX and is placed on the interface IF. The third transporter robot MTR3 transports the substrate W to the spin developer SD1 and the hard-bake unit HB1 for respective processing in series. Then third transporter robot MTR3 transports the substrate W to the cooling plate CP3 and the substrate W is temporarily held on the cooling plate CP3 waiting. The second transporter robot MTR2 comes to the cooling plate CP3 and takes the substrate W from the cooling plate CP3 and then transports the substrate W to the cooling plate CP1. The substrate W is temporarily held on the cooling plate CP1. The substrate W is then taken by the first transporter robot MTR1 and transported to the indexer IND. The substrate W is then inserted into the cassette CA.

As understood form the operations of the apparatus, substrates W can be exchanged or passed between the first and second transporter robots MTR1 and MTR2 via the cooling plate CP1, and between the second and third transporter robots MTR2 and MTR3 via the cooling plate CP3. Accordingly, no dedicated buffers are required and the plane size of the apparatus is not increased.

In particular, since the interfaces between the transporter robots are the cooling plates CP1 and CP3 which are in the first and second processing trains A1 and A2 stacked on the processing area A, the plane size of the apparatus is further reduced.

Further, the apparatus of FIG. 1 is arranged such that the transport area B is along only one side of the processing area A. Accordingly, the width of the apparatus is narrow as compared with the arrangements that processing areas are separated into two sub-areas and a transport area is provided between the sub-areas. Maintenance of the respective processing units is easy in the present apparatus because each processing unit can be accessed from both sides.

The transporter robots MTR1 to MTR3 are provided on the rails RA1 to RA3 which are arranged nearly in line. Transporter robots of a same type can be used as the transporter robots MTR1 to MTR3. Respective expansion ranges of the arms 21a, 21b, 22a, 22b, 23a and 23b required for insertion into respective processing units are short and mechanical loads on the arms are relatively small.

Figure 4:
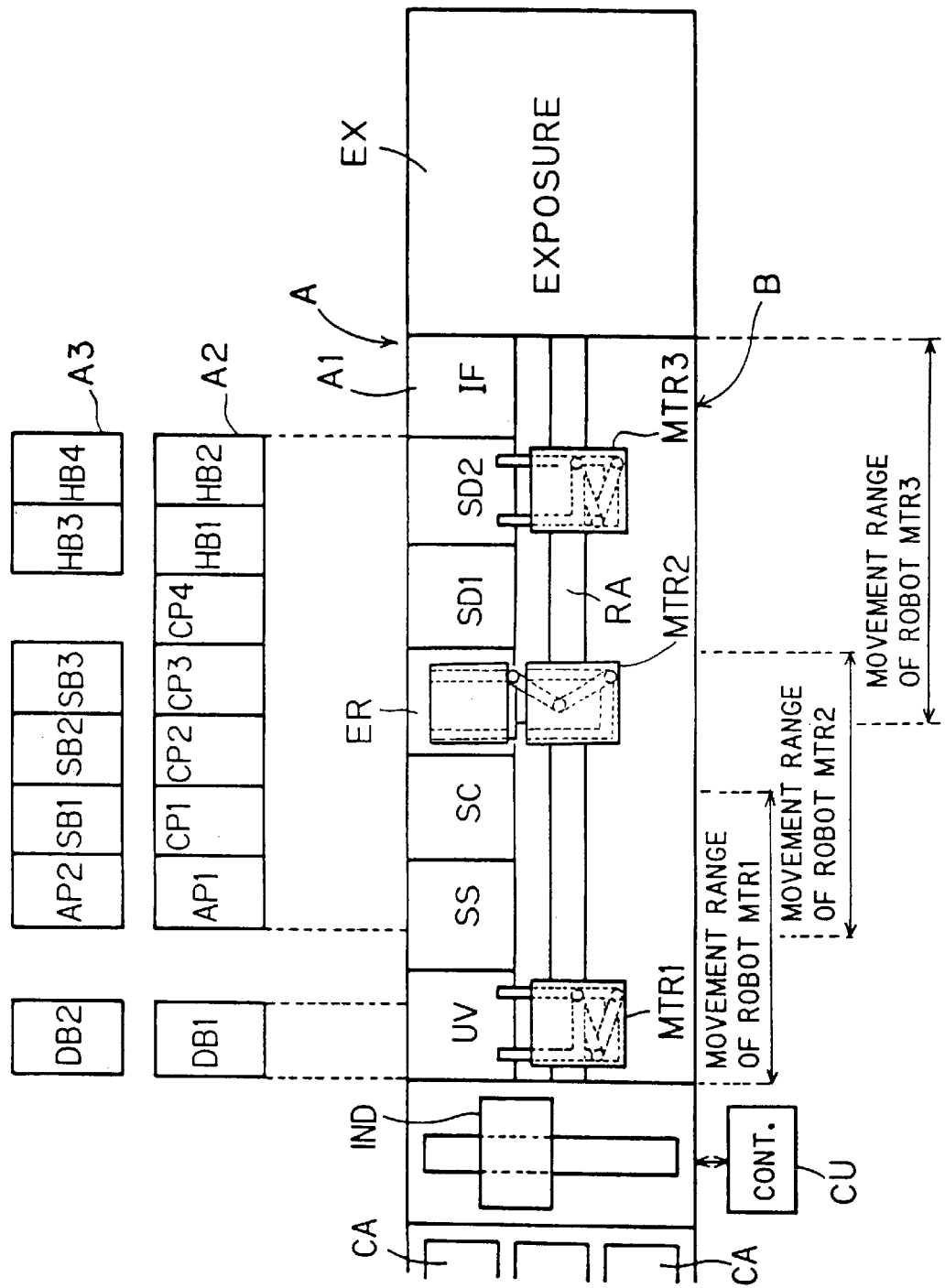
FIG. 4 illustrates an apparatus according to another preferred embodiment of the present invention.

As illustrated in FIG. 4, the transporter robots MTR1 to MTR3 may be provided on a common rail RA to simplify the construction. The respective movement ranges of the transporter robots MTR1 to MTR3 are:

1) the first range from the ultraviolet ray unit UV to the cooling plate CP1 for the first transporter robot MTR1;

2) the second range from the cooling plate CP1 to the cooling plate CP3 for the second transporter robot MTR2; and 3) the third range from the cooling plate CP3 for the interface IF. The control of the transporter robots MTR1 to MTR3 is conducted to prevent interference of the MTR1 to MTR3 on the common rail RA.

While the invention has been shown and described in detail, the foregoing description is in all aspects illustrative and not restrictive. It is therefore understood that numerous modifications and variations can be devised without departing from the scope of the invention.

I claim:

1. An apparatus for processing substrates, comprising:
   a) a processing system including:
      a-1) a first processing group having a plurality of processing units including a first processing unit for applying a first process to said substrates; and
      a-2) a second processing unit for applying a second process to said substrates; and
      a-3) a second processing group having a plurality of processing units including a third processing unit for applying a third process to said substrates; and
   b) a transporter system including:
      b-1) first transporter means transporting said substrates among said plurality of processing units of said first processing group and said second processing unit, said first transporter means including at least first and second substrate holding mechanisms adapted to perform a substrate exchange operation by unloading a first substrate from one of said processing units of said first processing group and said second processing unit into the first substrate holding mechanism and loading a second substrate from the second substrate holding mechanism into one of said processing units of said first processing group and said second processing unit; and
      b-2) second transporter means transporting said substrates among said second processing unit and said plurality of processing units of said second processing group, said second transporter means including at least third and fourth substrate holding mechanisms adapted to perform a substrate exchange operation by unloading a third substrate from one of said processing units of said second processing unit and one of said processing units of said second processing group into the third substrate holding mechanism and loading a fourth substrate from the fourth substrate holding mechanism into one of said second processing unit and one of said processing units of said second processing group.

2. The apparatus of claim 1, wherein said second processing unit is a thermal processing unit for applying a thermal process to said substrates.

3. The apparatus of claim 2, wherein said thermal processing unit is a cooling unit for cooling said substrates.

4. The apparatus of claim 3, further comprising:
   c) a control unit for controlling said transporter system such that said substrates await for said second transporter means on said cooling unit.

5. The apparatus of claim 4, wherein said first, second and third processing units are located at first, second and third positions separated from each other in a horizontal direction, respectively,
   said first transporter means includes
      b-1-1) a first transporter robot provided on a first rail and movable in said horizontal direction, wherein said first rail extends along said processing system and covers a first range including said first and second positions in said horizontal direction, and
   said second transporter means includes
      b-2-1) a second transporter robot provided on a second rail and movable in said horizontal direction, wherein said second rail extends along said processing system and covers a second range including said second and third positions in said horizontal direction.

6. The apparatus of claim 5, wherein said first range partially overlaps with said second range at a region including said second position in said horizontal direction.

7. The apparatus of claim 6, wherein said processing system includes a stack of processing trains, with each train being a linear arrangement of a plurality of processing units, and said first to third processing units are distributed in said stack of processing trains.

8. The apparatus of claim 4, wherein said first transporter means includes
      b-1-2) a first transporter robot provided on a rail extending along said processing system and movable in said horizontal direction, and
   said second transporter means includes
      b-2-2) a second transporter robot provided on said rail and movable in said horizontal direction.

9. A method of processing substrates, comprising the steps of:
   a) processing substrates in first processing means;
   b) transporting substrates between said first processing means and second processing means by first transporter means, said first transporter means including at least first and second substrate holding mechanisms adapted to perform a substrate exchange operation by unloading a substrate from one of said first processing means and said second processing means into said first substrate holding mechanism and loading a substrate from the second substrate holding mechanism into one of said first processing means and second processing means; and
   c) transporting substrates between said second processing means and third processing means by second transporter means, said second transporter means including at least third and fourth substrate holding mechanisms adapted to perform a substrate exchange operation by unloading a substrate from one of said second processing means and said third processing means into the third substrate holding mechanism and loading a substrate from the fourth substrate holding mechanism into one of said second processing means and said third processing means; and
   d) processing substrates in said third processing means.

10. The method of claim 9, further comprising the step of:
    e) processing said substrate in said second processing means after the step b) and before the step c).

11. The method of claim 10, wherein said second processing means is a thermal processing means for applying a thermal processing to said substrate.

12. The method of claim 11, wherein said thermal processing means is a cooling means for cooling said substrate.

13. The method of claim 12, wherein the step e) includes the step of:
    e-1 causing said substrate to await for said second transporter means on said cooling means.

14. The method of claim 13, wherein said first, second and third processing means are located at first, second and third positions which are separated from each other in a horizontal direction, the step b) includes the step of:
- b-1) moving said first transporter means along a first range which includes said first and second positions in said horizontal direction, and the step c) further includes the step of:
- c-1) moving said second transporter means along a second range which includes said second and third positions in said horizontal direction.

15. The method of claim 14, wherein said first range partially overlaps with said second range at a region including said second position in said horizontal direction.

16. The method of claim 15, wherein said first to third processing means are distributed in a stack of processing trains, with each train being a linear arrangement of a plurality of processing means.

17. The method of claim 13, wherein said first, second and third processing means are located at first, second and third positions which are separated from each other in a horizontal direction, and a rail is provided along a range including said first to third positions in said horizontal direction, the step b) includes the step of:
- b-1) moving said first transporter means on said rail in said horizontal direction, and the step c) further includes the step of:
- c-1) moving said second transporter means on said rail in said horizontal direction.

18. An apparatus for processing substrates, comprising:
- a) a processing system including:
  - a-1) a first processing group having at least three processing units including a thermal processing unit for applying a thermal process to said substrates; and
  - a-2) a second processing group having a plurality of processing units; and
- b) a transporter system including:
  - b-1) first transporter means transporting said substrates among said at least three processing units of said first processing group, said first transporter means including at least first and second substrate holding mechanisms adapted to perform a substrate exchange operation by unloading a first substrate from one of said processing units of first processing group into the first substrate holding mechanism and loading a second substrate from the second substrate holding mechanism into one of said first processing group; and
  - b-2) second transporter means transporting said substrates from said thermal processing unit to said second processing group and among said plurality of processing units of said second processing group, said second transporter means including at least third and fourth substrate holding mechanisms adapted to perform a substrate exchange operation by unloading a third substrate from one of said processing units of second processing group into the third substrate holding mechanism and loading a fourth substrate from the fourth substrate holding mechanism into one of said processing units of said second processing group.

19. The apparatus of claim 18, wherein said thermal processing unit is a cooling unit for cooling said substrates.

20. An apparatus for processing substrates, comprising:
- a) a processing system including:
  - a-1) a first processing unit applying a first process to said substrates;
  - a-2) a second processing unit applying a second process to said substrates; and
  - a-3) a third processing unit applying a third process to said substrates; and
- b) a transporter system including:
  - b-1) a first transporter transporting said substrates between said first processing unit and said second processing unit, said first transporter including at least first and second substrate holding mechanisms adapted to perform a substrate exchange operation by unloading a first substrate from either said first processing unit or said second processing unit into the first substrate holding mechanism and loading a second substrate from the second substrate holding mechanism into either said first processing unit or said second processing unit; and
  - b-2) a second transporter transporting said substrates between said second processing unit and said third processing unit, said second transporter including at least third and fourth substrate holding mechanisms adapted to perform a substrate exchange operation by unloading a third substrate from either said second processing unit or said third processing unit into the third substrate holding mechanism and loading a fourth substrate from the fourth substrate holding mechanism into either said second processing unit or said third processing unit.

21. The apparatus of claim 20, wherein said second processing unit is a thermal processing unit for applying a thermal process to said substrates.

22. The apparatus of claim 21, wherein said thermal processing unit is a cooling unit for cooling said substrates.

23. The apparatus of claim 22, wherein said first, second and third processing units are located at first, second and third positions separated from each other in a horizontal direction, said first transporter includes:
- b-1-1) a first transporter robot provided on a first rail and movable in said horizontal direction, wherein said first rail extends along said processing system and covers a first range including said first and second positions in said horizontal direction, and said second transporter includes:
- b-2-1) a second transporter robot provided on a second rail and movable in said horizontal direction, wherein said second rail extends along said processing system and covers a second range including said second and third positions in said horizontal direction.

24. The apparatus of claim 23, wherein said first range partially overlaps with said second range at a region including said second position in said horizontal direction.

25. The apparatus of claim 24, wherein said processing system includes a stack of processing trains, wherein each train is a linear arrangement of a plurality of processing units, and said first to third processing units are distributed in said stack of processing trains.

26. The apparatus of claim 22, wherein said first transporter includes:
   b-1-1) a first transporter robot provided on a rail extending along said processing system and movable in said horizontal direction, and
   said second transporter includes:
      b-2-2) a second transporter robot provided on said rail and movable in said horizontal direction.

27. The apparatus of claim 20, wherein said first transporter is a robot provided on a first rail, and said second transporter is a second robot provided on a second rail.

28. The apparatus of claim 20, wherein said transportation system lacks dedicated buffers for transporting said substrates from the first transporter to the second transporter.

29. A method of processing substrates, comprising the steps of:
   a) processing said substrates in a first processing unit;
   b) transporting said substrates between said first processing unit and a second processing unit by a first transporter, said first transporter including at least first and second substrate holding mechanisms adapted to perform a substrate exchange operation by unloading a substrate from either a first processing unit or a second processing unit into the first substrate holding mechanism and loading a substrate from the second substrate holding mechanism into either said first processing unit or said second processing unit;
   c) transporting said substrate between said second processing unit and a third processing unit by a second transporter, said second transporter including at least third and fourth substrate holding mechanisms adapted to perform a substrate exchange operation by unloading a substrate from either said second processing unit or a third processing unit into the third substrate holding mechanism and loading a substrate from the fourth substrate holding mechanism into either said second processing unit or said third processing unit; and
   d) processing said substrate in said third processing unit.

30. The method of claim 29, further comprising the step of:
   e) processing said substrate in said second processing unit after the step b) and before the step c).

31. A transporter for a substrate processing apparatus, the apparatus including a plurality of processing units for processing substrates, the transporter comprising at least first and second substrate holding mechanisms adapted to perform a substrate exchange operation by unloading a first substrate from a selected processing unit into the first substrate holding mechanism and loading a second substrate from the second substrate holding mechanism into the selected processing unit.

32. The transporter of claim 31, wherein the thermal processing unit is a cooling unit for cooling the substrates.

33. A method of processing a substrate, comprising the steps of:
   a) processing a first substrate in a first processing means;
   b) transporting said first substrate from said first processing means to a second processing means by a first transporter means, said first processing means including at least a first and second substrate holding mechanisms, including the steps of:
      b-1) unloading said first substrate from said first processing means into the first substrate holding mechanism;
      b-2) loading a second substrate from said second substrate holding mechanism into said first processing means; and
      b-3) loading said first substrate from said first substrate holding mechanism into said second processing means;
   c) transporting said first substrate from said second processing means to said third processing means by second transporter means, said second transporter means including at least a third and a fourth substrate holding mechanisms, including the steps of:
      c-1) unloading said first substrate from said second processing means into said third substrate holding mechanism;
      c-2) unloading a fourth substrate from said third processing means into the fourth substrate holding mechanism; and
      c-3) loading said first substrate from said third substrate holding mechanism into said third processing means; and
   d) processing said first substrate in said third processing means.

34. The method of claim 33, further comprising the step of:
   e) processing said first substrate in said second processing means after the step b) and before the step c).

35. The method of claim 34, wherein said second processing means is a thermal processing means for applying a thermal process to said first substrate.

36. The method of claim 35, wherein said thermal processing means is a cooling means for cooling said first substrate.

37. The method of claim 36, wherein the step e) includes the step of:
   e-1) causing said first substrate to await for said second transporter means on said cooling means.

38. The method of claim 37, wherein said first, second, and third processing means are located at first, second, and third positions which are separated from each other in a horizontal direction;
   the step b) includes the step of:
      b-1-1) moving said first transporter means along a first range which includes said first and second positions in said horizontal direction; and
   the step c) includes the step of:
      c-1-1) moving said second transporter means along a second range which includes said second and third positions in said horizontal direction.

39. The method of claim 38, wherein said first range partially overlaps with said second range at a region including said second position in said horizontal direction.

40. The method of claim 39, wherein said first, second, and third processing means are distributed in a stack of processing trains, with each train being a linear arrangement of a plurality of processing means.

41. The method of claim 37, wherein said first, second, and third processing means are located at first, second, and third positions which are separated from each other in a horizontal direction and a rail is provided along a range including said first, second, and third positions in said horizontal direction;
   the step b) includes the step of:
      b-1-1) moving said first transporter means on said rail in said horizontal direction; and
   the step c) further includes the step of:
      c-1-1) moving said second transporter means on said rail in said horizontal direction.

42. An apparatus for processing a substrate, comprising:
a) a processing system having an arrangement of:
   a-1) a first processing group having a plurality of processing units including a first processing unit for applying a first process to said substrate;
   a-2) a second processing unit for applying a second process to said substrate; and
   a-3) a second processing group having a plurality of processing units including a third processing unit for applying a third process to said substrate; and
b) a transporting system having:
   b-1) first transporter means transporting said substrates among said plurality of processing units of said first processing group and said second processing unit, said first transporter means including at least first and second substrate holding mechanisms and adapted to:
      unload a first substrate from said first-processing unit into the first substrate holding mechanism;
      load a second substrate from said second substrate holding mechanism into said first processing unit; and
      load said first substrate from said first substrate holding mechanism into said second processing unit; and
   b-2) second transporter mean transporting said substrates among said second processing unit and said plurality of processing units of second processing group, said second transporter means including at least a third and a fourth substrate holding mechanisms and adapted to:
      unload said first substrate from said second processing means into said third substrate holding mechanism;
      unload a fourth substrate from said third processing unit into said fourth substrate holding mechanism; and
      load said first substrate from said third substrate holding mechanism into said third processing unit.

43. The apparatus of claim 42, wherein said second processing means is a thermal processing means for applying a thermal process to said first substrate.

44. The apparatus of claim 43, wherein said thermal processing means is a cooling means for cooling said first substrate.

45. The apparatus of claim 44, further comprising:
c) control unit for controlling said transporter system such that said first substrate awaits for said second transporter means on said cooling means.

46. The apparatus of claim 45, wherein said first, second, and third processing means are located at first, second, and third positions separated from each other in a horizontal direction, respectively, said first transporter means including:
   b-1-1) a first transporter robot provided on a first rail and movable in said horizontal direction, wherein said first rail extends along said processing system and covers a first range including said first and second positions in said horizontal direction; and
   said second transporter means including:
   b-2-1) a second transporter robot provided on a second rail and movable in said horizontal direction, wherein said second rail extends along said processing system and covers a second range including said second and third positions in said horizontal direction.

47. The apparatus of claim 46, wherein said first range partially overlaps with second range at a region including said second position in said horizontal direction.

48. The apparatus of claim 47, wherein said arrangement of said processing system is a stack of processing trains, with each train being a linear arrangement of a plurality of processing means; and
   said first, second, and third processing means are distributed in said stack of processing trains.

49. The apparatus of claim 45, wherein said first transporter means including:
   b-1-2) a first transporter robot provided on a rail extending along said processing system and movable in said horizontal direction; and
   said second transporter means including:
   b-2-2) a second transporter robot provided on said rail and movable in said horizontal direction.

50. An apparatus for processing substrates, comprising:
a) a processing system including:
   a-1) a first processing group having at least three process units including a thermal processing unit for applying a thermal process to said substrates; and
   a-2) a second processing group having a plurality of processing units; and
b) a transporter system including:
   b-1) first transporter means transporting said substrates among said at least three processing units of said first processing group, said first transporter means including at least a first and a second substrate holding mechanisms and adapted to:
      unload a first substrate from a list processing unit into said first substrate holding mechanism, said first processing unit being one of said at least three processing units of said first processing group other than said thermal processing unit;
      load a second substrate from said second substrate holding mechanism into said first processing unit; and
      load said first substrate from said first substrate holding mechanism into said thermal processing unit; and
   b-2) second transporter means transporting said substrates from said thermal processing unit to said second processing group and among said plurality of processing units of said second processing group, said second transporter means including at least a third and a fourth substrate holding mechanism and adapted to:
      unload said first substrate from said thermal processing unit into said third substrate holding mechanism;
      unload a fourth substrate from a second processing unit into said fourth substrate holding mechanism, said second processing unit being one of said at least two processing units of said second processing group; and
      load said first substrate from said third substrate holding mechanism into said second processing unit.

51. The apparatus of claim 50, wherein said thermal processing unit is a cooling unit for cooling said substrates.

52. An apparatus for processing substrates, comprising:
a) a processing system including:
   a-1) a first processing unit applying a first process to said substrates;
   a-2) a second processing unit applying second process to said substrates; and a-3) a third processing unit applying a third process to said substrates; and b) a transporter system including:
  b-1) first transporter transporting said substrates from said first processing unit to said second processing unit by first transporter means, said first transporter including at least a first and a second substrate holding mechanism, and adapted to:
    unload a first substrate from said first processing unit into said first substrate holding mechanism;
    load a second substrate from said second substrate holding mechanism into said first processing unit; and
    load said first substrate from said first substrate holding mechanism into said second processing unit; and
  b-2) second transporter transporting said substrates from said second processing unit to said third processing unit, said second transporter including at least a third and a fourth substrate holding mechanisms, and adapted to:
    unload said first substrate from said second processing unit into said third substrate holding mechanism;
    unload a fourth substrate from said third processing unit into said fourth substrate holding mechanism; and
    load said first substrate from said third substrate holding mechanism into said third processing units.

53. The apparatus of claim 52, wherein said second processing unit is a thermal processing unit for applying a thermal process to said substrates.

54. The apparatus of claim 53, wherein said thermal processing unit is a cooling unit for cooling said substrates.

55. The apparatus of claim 54, wherein said first, second, and third processing units are located at first, second, and third positions separated from each other in a horizontal direction;
  said first transporter includes:
    b-1-1) a first transporter robot provided on a first rail and movable in said horizontal direction, wherein said first rail extends along said processing system and covers a first range including said first and second positions in said horizontal direction; and
  said second transporter includes:
    b-2-1) a second transporter robot provided on a second rail and movable in said horizontal direction, wherein said second rail extends along said processing system and covers a second range including said second and third positions in said horizontal direction.

56. The apparatus of claim 55, wherein said first range partially overlaps with said second range at a region including said second position in said horizontal direction.

57. The apparatus of claim 56, wherein said arrangement of said processing system is a stack of processing trains, wherein each train is a linear arrangement of a plurality of processing units; and
  said first to third processing units are distributed in said stack of processing trains.

58. The apparatus of claim 54, wherein said first transporter includes:
  b-1-1) a first transporter robot provided on a rail extending along said processing system and movable in a horizontal direction; and
  said second transporter includes:
    b-2-1) a second transporter robot provided on said rail and movable in said horizontal direction.

59. The apparatus of claim 52, wherein said transportation system lacks dedicated buffers for transporting said substrate from said first transporter to said second transporter.

60. The apparatus of claim 52, wherein said first transporter is a robot provided on a first rail, and said second transporter is a second robot provided on a second rail.

61. A method of processing a substrate, comprising the steps of:
  a) processing a first substrate in first processing unit;
  b) transporting said first substrate from a first processing unit to a second processing unit by first transporter means, said first transporter means including at least a first and a second substrate holding mechanisms, including the steps of:
    b-1) unloading said first substrate from said processing unit into said first substrate holding mechanism;
    b-2) loading a second substrate from said second substrate holding mechanism into said first processing unit; and
    b-3) loading said first substrate from said first substrate holding mechanism into said second processing unit;
  c) transporting said first substrate from said second processing unit to a third processing unit by second transporter means, said second transporter means including at least a third and a fourth substrate holding mechanisms, including the steps of:
    c-1) unloading said first substrate from said second processing unit into said third substrate holding mechanism;
    c-2) unloading a fourth substrate from said third processing unit into said fourth substrate holding mechanism; and
    c-3) loading said first substrate from said third substrate holding mechanism into said third processing unit; and
  d) processing said first substrate in said third processing unit.

62. The method of claim 61, further comprising the step of:
  e) processing said substrate in said second processing unit after the step b) and before the step c).

* * * * *